(12) United States Patent
Jacke et al.

(10) Patent No.: US 10,490,994 B2
(45) Date of Patent: Nov. 26, 2019

(54) METHOD AND DEVICE FOR CURRENT SENSING OF SMALL CURRENTS

(71) Applicant: Robert Bosch GmbH, Stuttgart (DE)

(72) Inventors: Thomas Jacke, Tuebingen (DE); Werner Schiemann, Fellbach (DE)

(73) Assignee: Robert Bosch GmbH, Stuttgart (DE)

( * ) Notice: Subject to any disclaimer, the term of this patent is extended or adjusted under 35 U.S.C. 154(b) by 234 days.

(21) Appl. No.: 15/318,213

(22) PCT Filed: Apr. 24, 2015

(86) PCT No.: PCT/EP2015/058922
§ 371 (c)(1),
(2) Date: Dec. 12, 2016

(87) PCT Pub. No.: WO2015/197230
PCT Pub. Date: Dec. 30, 2015

(65) Prior Publication Data
US 2017/0110870 A1 Apr. 20, 2017

(30) Foreign Application Priority Data

Jun. 23, 2014 (DE) .................. 10 2014 211 984

(51) Int. Cl.
*H02H 1/00* (2006.01)
*G01R 19/00* (2006.01)
(Continued)

(52) U.S. Cl.
CPC ....... *H02H 1/0007* (2013.01); *G01R 19/0092* (2013.01); *H02H 7/20* (2013.01);
(Continued)

(58) Field of Classification Search
CPC ...... G01R 19/0092; G01R 31/006–007; H02H 1/0007; H03K 17/00–98
See application file for complete search history.

(56) References Cited

U.S. PATENT DOCUMENTS

| 4,553,084 A * | 11/1985 | Wrathall | ............... G01R 17/06 323/314 |
| 2010/0007327 A1 | 1/2010 | Andoh et al. | |

(Continued)

FOREIGN PATENT DOCUMENTS

| JP | 11083911 A * | 3/1999 | ......... G01R 19/0092 |
| JP | 2006012960 A | 1/2006 | |

OTHER PUBLICATIONS

Abstract for JP11-83911. Published Mar. 26, 1999.*
(Continued)

*Primary Examiner* — Ronald W Leja
*Assistant Examiner* — Christopher J Clark
(74) *Attorney, Agent, or Firm* — Norton Rose Fulbright US LLP; Gerard Messina

(57) ABSTRACT

A device for current sensing of a power transistor system having a power transistor, a first series circuit which includes a first transistor and a first resistance, the first resistance disposed in a load circuit of the first transistor, a second series circuit which has a second transistor and a second resistance disposed in a load circuit of the second transistor, the first series circuit, the second series circuit and the power transistor situated in parallel with one another, the first resistance connected to the first transistor in an electrically conductive manner when the first transistor is switched on, and the second resistance connected to the second transistor in an electrically conductive manner when the second transistor is switched on, and a gate terminal of the first transistor is connected in an electrically conductive manner to a gate terminal of the power transistor when the power transistor is switched on.

9 Claims, 2 Drawing Sheets

(51) Int. Cl.
*H03K 17/082* (2006.01)
*H02H 7/20* (2006.01)
H03K 17/10 (2006.01)
G01R 31/00 (2006.01)

(52) U.S. Cl.
CPC ....... *H03K 17/0822* (2013.01); *G01R 31/005* (2013.01); *G01R 31/006* (2013.01); *H03K 17/102* (2013.01); *H03K 2217/0027* (2013.01)

(56) References Cited

U.S. PATENT DOCUMENTS

2014/0167797 A1 6/2014 Aerts
2015/0377931 A1* 12/2015 Sander ............... G01R 19/0092
324/126

OTHER PUBLICATIONS

International Search Report dated Jul. 21, 2015, of the corresponding International Application PCT/EP205/058922 filed Apr. 24, 2015.

\* cited by examiner

METHOD AND DEVICE FOR CURRENT SENSING OF SMALL CURRENTS

FIELD

The present invention relates to a device and a method for current sensing of a power transistor system, and to a safety switch having such a device.

BACKGROUND INFORMATION

Known as an indirect method for current sensing on a switch or transistor is the measuring of the forward voltage of the switch. Since the forward voltage in the Ohmic range supplies a voltage that is proportional to the current, it is possible to ascertain the current with the aid of the forward resistance.

Furthermore, in convention methods for current sensing, a current-sensing circuit is switched in parallel with the load circuit so that the current in the load circuit can be ascertained. To do so, a current-sensing transistor may be integrated on the same chip parallel to the load transistor. Both the drain terminals and the gate terminals of the two transistors are connected to each other. To ascertain the load current, the voltage drop at the current-sensing resistance is sensed.

This has the disadvantage that batch variations or non-linearities of the resistances of the current sensing transistor directly affect the current dividing ratio and have a direct influence on the voltage at the current-sensing resistance.

Furthermore, conventionally, current sensing is carried out with the aid of analog-to-digital converters. In order to achieve an accurate measurement, a precise measuring resistor must be used. Because of the linearity of the measuring resistor, an adapted evaluation circuit featuring a high dynamic range is able to detect currents.

In this context it is disadvantageous that the evaluation circuit restricts the measuring range to small currents, such as on account of offset voltages.

An objective of the present invention is to detect small currents with high precision.

SUMMARY

In accordance with the present invention, a device and a method are provided for current sensing of a power transistor system include a power transistor, a first series circuit and a second series circuit, which are situated in parallel with each other. The first series circuit has a first transistor and a first resistance, the first resistance being situated in the load circuit of the first transistor. The second series circuit has a second transistor and a second resistance, and the second resistance is situated in the load circuit of the second transistor. The first resistance is connected to the first transistor in an electrically conductive manner when the first transistor is switched on, i.e., is conducting. Connected in an electrically conductive manner here means that the load circuit is current-carrying. The second resistance is electrically conductively connected to the second transistor when the second transistor is switched on, i.e., is conducting. A gate terminal of the first transistor is electrically conductively connected to a gate terminal of the power transistor when the power transistor is switched on. The second series circuit conducts when the power transistor is switched off. In addition, a control unit is provided which actuates the power transistor, the first transistor and the second transistor. The control unit switches on the power transistor and the first transistor and senses a first voltage potential. The first voltage potential represents a voltage drop at the first resistance. The control unit determines a current as a function of the first voltage potential and the first resistance. The control unit switches off the power transistor and the first transistor when the total current is lower than a predefined threshold value. At the same time, the control unit switches the second transistor on so that the current is in effect flowing across the second transistor. The predefined threshold value represents a low current in the load circuit of the power transistor.

This is advantageous insofar as smaller currents are able to be measured in the power transistor system because of the switch-off of the power transistor and the first transistor.

In a further development, the control unit has a timing circuit so that the control unit carries out the switch-off of the first transistor for a certain period of time.

This is advantageous insofar as the total losses of the device are minimized when the first transistor is switched off for only a certain period of time.

In one further refinement, the first resistance and the second resistance have different resistance values. The first resistance, in particular, has a smaller resistance value than the second resistance, preferably at least one tenth of the resistance value of the second resistance.

This has the advantage that currents of different magnitudes are able to be sensed in the series circuits connected in parallel.

In one further refinement, a forward resistance of the second transistor functions as second resistance.

This has the advantage that no additional measuring resistor is required and the system becomes more compact as a result.

In one further refinement, the first transistor and the second transistor have an identical transistor type. More specifically, n-MOS or p-MOS transistors are involved.

This is advantageous insofar as the structure of the device is simplified.

A safety switch according to the present invention for vehicle electrical system loads includes the device for current sensing of a power transistor system according to the present invention. The safety switch may function as a low-side switch or as a high-side switch. In the case of a low-side switch, the safety switch has a load resistor that connects a drain terminal of the power transistor to a supply voltage. In the case of a high-side switch, the safety switch has a load resistor that connects a source terminal of the power transistor to a ground.

Additional advantages result from the description herein of exemplary embodiments.

BRIEF DESCRIPTION OF THE DRAWINGS

The present invention is described below with the aid of preferred specific embodiments and appended figures.

DETAILED DESCRIPTION OF EXAMPLE EMBODIMENTS

Figure 1:
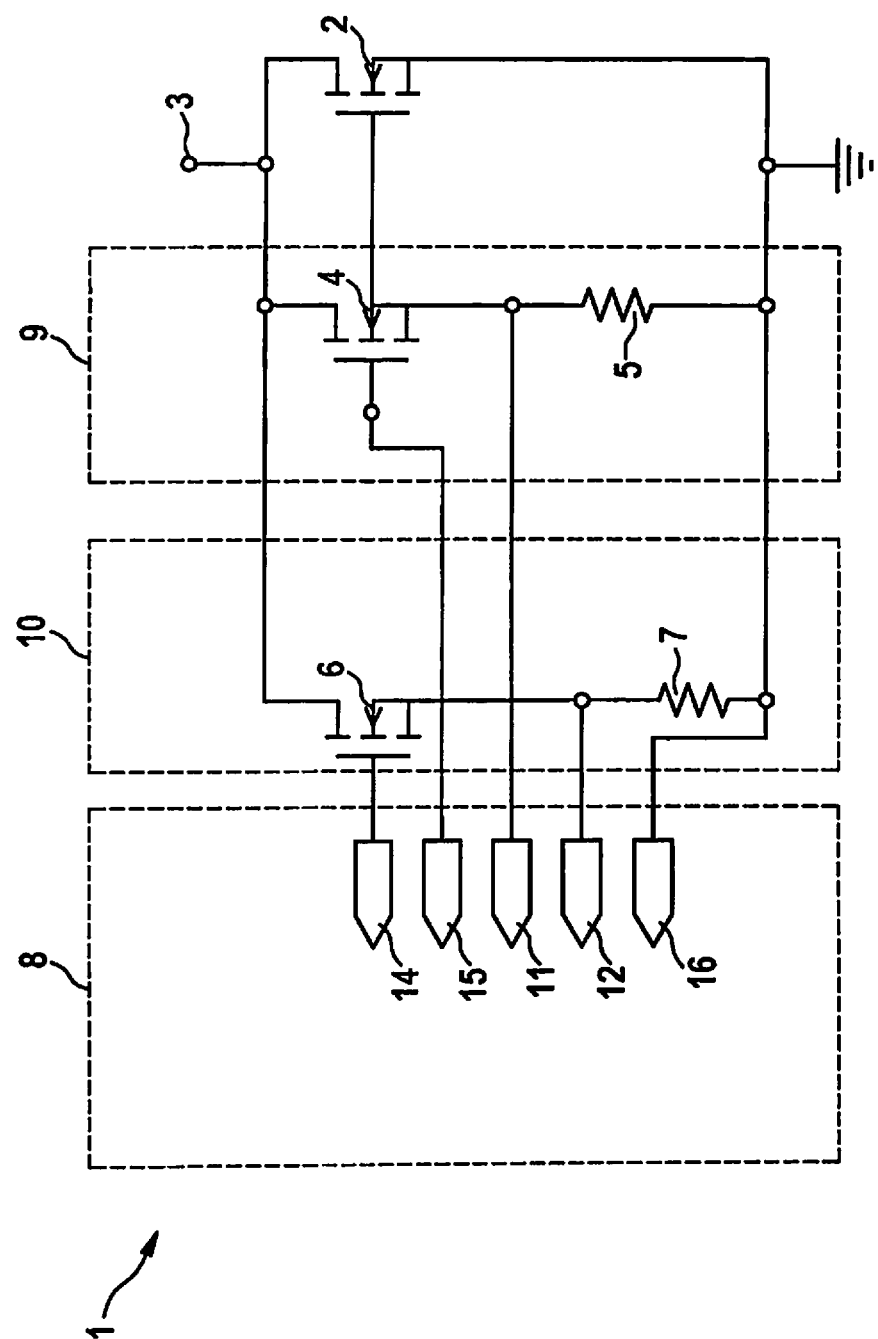
FIG. 1 shows a device for current sensing of a power transistor system.

FIG. 1 shows a device 1 for current sensing of a power transistor 2. Device 1 has a control unit 8, a first series circuit 9 and a second series circuit 10. First series circuit 9 and second series circuit 10 are situated in parallel with each other. First series circuit 9 has a first transistor 4 and a first resistance 5. First resistance 5 is situated in the load circuit of first transistor 4, i.e. first resistance 5 is connected to first transistor 4 in an electrically conductive manner when first transistor (4) is switched on. In this context, connected in an electrically conductive manner means that the load circuit conducts a current. Second series circuit 10 has a second transistor 5 and a second resistance 7, which means that second resistance 7 is connected to second transistor 6 in an electrically conductive manner when second transistor (6) is switched on. Second resistance 7 is disposed in the load circuit of second transistor 5. First resistance 5 and second resistance 7 act as measuring resistances, so-called current-sensing resistances or sensing resistances, first resistance 5 having a lower value than second resistance 7, which is generally selected to provide high resistance. The ratio of second resistance 7 to first resistance 5, for example, amounts to 1/N*FL, N being the divisor ratio or the ratio of size of power transistor 2 and first transistor 4. FL is the ratio of load current to quiescent current in the load circuit of the power transistor. In one exemplary embodiment, a divisor ratio is N=1000 and a load to quiescent current ratio is FL=1 A/0.1 mA, first resistance 5 in this case having a value of 300 Ohm, for example, and the second resistance having a value of 3000 Ohm, for instance.

Optionally, a forward resistance of second transistor 5 may function as second resistance 7.

Control unit 8 has at least two inputs by which first voltage potential 11 and second voltage potential 12 are able to be sensed, and an input 16 which is able to sense a reference voltage, such as ground. In addition, control unit 8 has at least one first output 14 and a second output 15. First output 14 actuates a gate of second transistor 6, and second output 15 actuates a gate of power transistor 2 and first transistor 4. Device 1 includes the power transistor system at which first series circuit 9 and second series circuit 10 are situated parallel to the load circuit of power transistor 2. The gate terminal of first transistor 4 is connected to the gate terminal of power transistor 2. If power transistor 2 is switched on, then first transistor 4 is also switched on through the direct connection of the gates. A drain terminal 3 of power transistor 2 can be connected to a supply voltage.

In one further exemplary embodiment, device 1 is used in a low-side switch for an electrical load, such as the lighting system or the control device in a vehicle, whereby the ground of the electrical load is connected. For this purpose, drain terminal 3 of power transistor 2 is connected to a supply voltage via the electrical load.

In one further exemplary embodiment, device 1 is used in a high-side switch for an electrical load, such as the illumination system or the control device in a car, whereby the supply voltage of the electrical load is connected. To do so, the source terminal of power transistor 2 is connected to ground via the electrical load, and the drain terminal of power transistor 2 is connected to the supply voltage.

In another exemplary embodiment, device 1 is used in a level shifter which functions as a low-side switch, whereby the ground of the level shifter is connected. To do so, drain terminal 3 of power transistor 2 is connected to the supply voltage via a load resistor.

In a further exemplary embodiment, device 1 is used in a level shifter which functions as a high-side switch, whereby the supply voltage pin of the level shifter is connected. For this purpose, a source terminal of power transistor 2 is connected to ground via a load resistor and the drain terminal of power transistor 2 is connected to the supply voltage.

In a further exemplary embodiment, second series circuit 10 is integrated in an ASIC together with a signal evaluation unit. Because of the high-resistance second resistance, the integration takes place in a space-saving manner. An adjustment is easily realizable in a final inspection of the ASIC. It is optionally possible to integrate the gate drivers of first and second transistors 4 and 6 on the ASIC.

Figure 2:
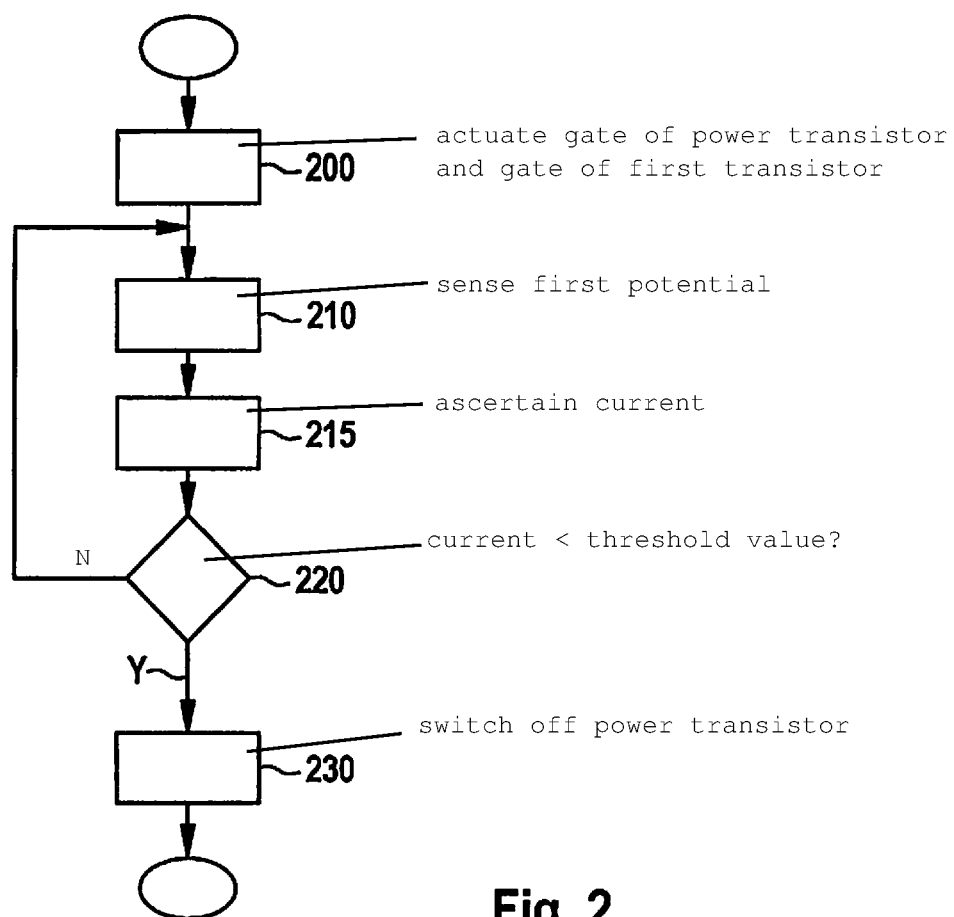
FIG. 2 shows a method for current sensing of a power transistor system.
Figure 3:
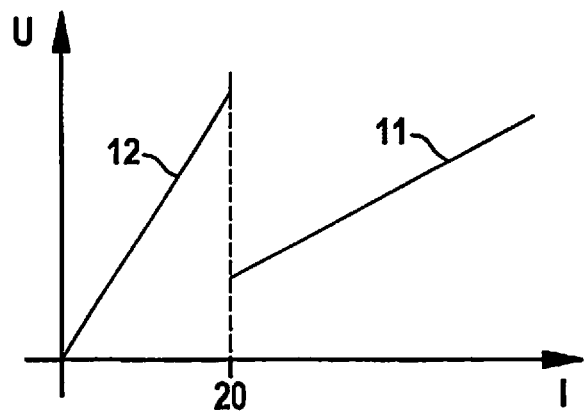
FIG. 3 shows a current-voltage diagram which features a predefined threshold value which represents a low current in the load circuit of the power transistor.

FIG. 2 shows a method for current sensing of a power transistor. The method starts with step 200 by the actuation or switch-on of a gate of a power transistor and a gate of a first transistor with the aid of a control unit. This energizes the first resistance so that in a subsequent step 210, a first voltage potential that represents a voltage drop at the first resistance is sensed. In a following step 215, a current is ascertained as a function of the first voltage potential of the first voltage potential and the first resistance. In a subsequent step 220, it is checked whether the current lies below a predefined threshold value 20, which is shown in FIG. 3 and which limits the current range of the electrical load in the power circuit or load circuit of the power transistor. The predefined threshold value is smaller than 1 mA, in particular. If this is the case, then the power transistor and the first transistor are switched off in a following step 230, and the first transistor is switched on so that the low current is able to be sensed with the aid of the second transistor. If this is not the case, then the method is ended or continued by step 210.

In step 230, it is optionally possible to switch the power transistor and the first transistor off for a certain period of time, preferably for a short period of time, such as in the nanosecond range, so that the losses in the device are minimized. After the time period has elapsed, the power transistor and the first transistor are switched on again and the second transistor is switched off, so that the method continues by step 210.

In a further exemplary embodiment, the method is started by the actuation or switch-on of a gate of the first transistor and a gate of the second transistor on with the aid of the control unit. This energizes the first resistance and the second resistance so that in a following step, a first voltage potential, which represents a voltage drop at the first resistance, and a second voltage potential, which represents a voltage drop at the second resistance, are sensed. In a following step, a total current is ascertained as a function of a first partial current and a second partial current or the first partial current and the second partial current are summed up. The first partial current is ascertained as a function of the first voltage potential and the first resistance, and the second partial current is ascertained as a function of the second voltage potential and the second resistance. In a subsequent step, it is checked whether the current lies below a predefined threshold value 20, which is shown in FIG. 3. The predefined threshold value is less than 1 mA, in particular. If this is the case, then the first transistor is switched off in a following step, so that the low total current is able to be sensed with the aid of the second transistor. If this is not the case, the method is terminated.

What is claimed is:

1. A device for current sensing of a power transistor system, comprising:
   a power transistor;
   a first series circuit which has a first transistor and a first resistance, the first resistance being situated in a load circuit of the first transistor;

a second series circuit which has a second transistor and a second resistance, the second resistance being situated in a load circuit of the second transistor, the first series circuit, the second series circuit, and the power transistor being situated in parallel with one another, the first resistance being connected to the first transistor in an electrically conductive manner when the first transistor is switched on, and the second resistance being connected to the second transistor in an electrically conductive manner when the second transistor is switched on, a gate terminal of the first transistor being connected to a gate terminal of the power transistor in an electrically conductive manner when the power transistor is switched on; and a control unit configured to: switch on the power transistor and the first transistor, sense a first voltage potential which represents a voltage drop at the first resistance, ascertain a current as a function of the first voltage potential and the first resistance, and switch off the power transistor and the first transistor when the current is lower than a predefined threshold value, while switching on the second transistor so that an overall current is in effect flowing across the second transistor.

2. The device as recited in claim 1, wherein the control unit has a timing circuit so that the control unit carries out the switch-off of the power transistor and the first transistor for a certain period of time.

3. The device as recited in claim 1, wherein the first resistance and the second resistance have different resistance values, the first resistance having at least one tenth of the resistance value of the second resistance.

4. The device as recited in claim 1, wherein a forward resistance of the second transistor is provided as second resistance.

5. The device as recited in claim 1, wherein the first transistor and the second transistor have an identical transistor type, the transistor type being one of an n-MOS or a p-MOS transistor.

6. A safety switch for automotive electrical system loads having a device for current sensing of a power transistor system, the safety switch functioning as low-side switch, comprising:
   a power transistor;
   a control unit;
   a load resistance which connects a drain terminal of the power transistor to a supply voltage;
   a first series circuit having a first transistor and a first resistance, the first resistance being situated in a load circuit of the first transistor; and
   a second series circuit having a second transistor and a second resistance, the second resistance being situated in a load circuit of the second transistor, the first series circuit, the second series circuit, and the power transistor being situated in parallel with one another, the first resistance being connected to the first transistor in an electrically conductive manner when the first transistor is switched on, and the second resistance being connected to the second transistor in an electrically conductive manner when the second transistor is switched on, a gate terminal of the first transistor being connected to a gate terminal of the power transistor in an electrically conductive manner when the power transistor is switched on;
   wherein the control unit is designed to: switch on the power transistor and the first transistor, sense a first voltage potential which represents a voltage drop at the first resistance, ascertain a current, and switch off the power transistor and the first transistor when the current is lower than a predefined threshold value, while switching on the second transistor so that an overall current is in effect flowing across the second transistor.

7. A safety switch for automotive electrical system loads having a device for current sensing of a power transistor system, the safety switch functioning as high-side switch, comprising:
   a power transistor;
   a control unit;
   a load resistor which connects a source terminal of the power transistor to ground;
   a first series circuit having a first transistor and a first resistance, the first resistance being situated in a load circuit of the first transistor; and
   a second series circuit having a second transistor and a second resistance, the second resistance being situated in a load circuit of the second transistor, the first series circuit, the second series circuit, and the power transistor being situated in parallel with one another, the first resistance being connected to the first transistor in an electrically conductive manner when the first transistor is switched on, and the second resistance being connected to the second transistor in an electrically conductive manner when the second transistor is switched on, a gate terminal of the first transistor being connected to a gate terminal of the power transistor in an electrically conductive manner when the power transistor is switched on;
   wherein the control unit is designed to: switch on the power transistor and the first transistor, sense a first voltage potential which represents a voltage drop at the first resistance, ascertain a current, and switch off the power transistor and the first transistor when the current is lower than a predefined threshold value while switching on the second transistor so that an overall current is in effect flowing across the second transistor.

8. A method for current sensing of a power transistor system that includes a power transistor; a first series circuit which has a first transistor and a first resistance, the first resistance being situated in a load circuit of the first transistor; a second series circuit which has a second transistor and a second resistance, the second resistance being situated in a load circuit of the second transistor, the first series circuit, the second series circuit, and the power transistor being situated in parallel with one another, the first resistance being connected to the first transistor in an electrically conductive manner when the first transistor is switched on, and the second resistance being connected to the second transistor in an electrically conductive manner when the second transistor is switched on, a gate terminal of the first transistor being connected to a gate terminal of the power transistor in an electrically conductive manner when the power transistor is switched on; and a control unit, the method comprising:
   switching on the power transistor and the first transistor with the aid of the control unit, so that the first resistance in the load circuit of the first transistor is energized;
   sensing a first voltage potential which represents a voltage drop at the first resistance;
   ascertaining a current with the aid of the control unit as a function of the first voltage potential and the first resistance; and
   switching off the power transistor and the first transistor with the aid of the control unit when the current is lower than a predefined threshold value, with the second transistor being switched on so that an overall current is in effect flowing across the second transistor.

9. The method as recited in claim 8, wherein the switch-off of the first transistor is carried out for a specific time.

\* \* \* \* \*